(12) United States Patent
Kim

(10) Patent No.: US 8,711,978 B2
(45) Date of Patent: Apr. 29, 2014

(54) METHOD AND APPARATUS OF COMMUNICATION USING SOFT DECISION

(75) Inventor: Yong Ho Kim, Anyang-Si (KR)

(73) Assignee: LG Electronics Inc., Seoul (KR)

( * ) Notice: Subject to any disclaimer, the term of this patent is extended or adjusted under 35 U.S.C. 154(b) by 864 days.

(21) Appl. No.: 12/741,301

(22) PCT Filed: Dec. 9, 2008

(86) PCT No.: PCT/KR2008/007272
§ 371 (c)(1),
(2), (4) Date: Aug. 2, 2010

(87) PCT Pub. No.: WO2009/075508
PCT Pub. Date: Jun. 18, 2009

(65) Prior Publication Data
US 2010/0296601 A1  Nov. 25, 2010

Related U.S. Application Data

(60) Provisional application No. 61/012,787, filed on Dec. 11, 2007.

(30) Foreign Application Priority Data

Jul. 21, 2008  (KR) .................. 10-2008-0070503

(51) Int. Cl.
*H04L 27/00*  (2006.01)

(52) U.S. Cl.
USPC ........................... 375/316; 375/340; 375/295

(58) Field of Classification Search
USPC .......................... 375/316, 340, 295
See application file for complete search history.

(56) References Cited

U.S. PATENT DOCUMENTS 6,418,549 B1    7/2002  Ramchandran et al.
6,553,536 B1 *  4/2003  Hassner et al. ............... 714/780
(Continued)

FOREIGN PATENT DOCUMENTS

EP  0674316 B1  5/2006
EP  1623514 B1  9/2006
(Continued)

OTHER PUBLICATIONS

Fossorier et al., "Computationally Efficient Soft-Decision Decoding of Linear Block Codes Based on Ordered Statistics," IEEE Transactions on Information Theory, vol. 42, No. 3, May 1996.

(Continued)

*Primary Examiner* — Michael Neff
(74) *Attorney, Agent, or Firm* — Birch, Stewart, Kolasch & Birch, LLP

(57) ABSTRACT

A method for performing a reliable communication using soft decision information and a random linear coding in the wireless access system is disclosed. The communication method includes arranging received random-linear-coded first code blocks in descending order of their soft decision levels, and performing a random linear decoding on a first code block set, wherein the first code block set is constructed of the first code blocks arranged in the descending order of their soft decision levels. If any error occurs in the random linear decoding step of the first code block set, the method further includes performing a random linear decoding on a second code block set, wherein the second code block set is constructed when a code block having the lowest soft decision level among code blocks contained in the first code block set is replaced with another first code block.

8 Claims, 8 Drawing Sheets

(56) References Cited

U.S. PATENT DOCUMENTS

| | | |
|---|---|---|
| 6,615,382 B1 | 9/2003 | Kang et al. |
| 6,647,528 B1 | 11/2003 | Collette et al. |
| 7,075,917 B2 | 7/2006 | Herrmann |
| 7,213,189 B2 | 5/2007 | Malm |
| 7,320,091 B2 | 1/2008 | Blaauw et al. |
| 7,391,723 B2 | 6/2008 | Collette et al. |
| 7,512,860 B2 | 3/2009 | Miyazaki et al. |
| 2002/0106004 A1* | 8/2002 | Tan ................................ 375/140 |
| 2006/0149753 A1 | 7/2006 | Medard et al. |
| 2007/0030799 A1* | 2/2007 | Kaburaki et al. ............. 370/216 |
| 2009/0187804 A1 | 7/2009 | Shen et al. |
| 2010/0260241 A1 | 10/2010 | Kim |
| 2010/0296601 A1 | 11/2010 | Kim |
| 2011/0041041 A1 | 2/2011 | Kim |
| 2011/0044180 A1 | 2/2011 | Kim |
| 2011/0173517 A1 | 7/2011 | Kim |

FOREIGN PATENT DOCUMENTS

| | | |
|---|---|---|
| KR | 10-0400056 A | 9/2003 |
| KR | 10-0548314 B1 | 1/2006 |

OTHER PUBLICATIONS

Fossorier et al., "Soft-Decision Decoding of Linear Block Codes Based on Ordered Statistics," IEEE Transactions on Information Theory, vol. 41, No. 5, Sep. 1995.

* cited by examiner (a)

(b)

d₁ :Soft Decision Area1
d₂ :Soft Decision Area2
d₃ :Soft Decision Area3
d₄ :Soft Decision Area4

Fig. 8

METHOD AND APPARATUS OF COMMUNICATION USING SOFT DECISION

This application is the National Phase of PCT/KR2008/007272 filed on Dec. 9, 2008, which claims priority under 35 U.S.C. 119(e) to U.S. Provisional Application No. 61/012,787 filed on Dec. 11, 2007 and under 35 U.S.C. 119(a) to Patent Application No. 10-2008-0070503 filed in Republic of Korea on Jul. 21, 2008, all of which are hereby expressly incorporated by reference into the present application.

TECHNICAL FIELD

The present invention relates to a wireless access system, and more particularly to a method for performing a reliable communication using soft decision information and a random linear coding in the wireless access system.

BACKGROUND ART

Hereinafter, a general modulation technology for use in data communication will be described in detail.

A term "modulation" represents that signal information is modified into another suitable for channel characteristics of a transmission medium. For example, intensity, displacement, frequency or phase of the signal information may be modified according to the channel characteristics of the transmission medium. If the signal information is modulated using a modulation method suitable for the transmission medium, the signal information can be transferred to a long distance.

A user is able to construct several frequency channels in a wide frequency band. The user modulates specific data, such that it can provide a subscriber with data over the several frequency channels. Also, as a frequency gradually increases in case of modulating data, an antenna length is gradually shortened in proportion to the increasing frequency. In addition, in case of modulating data, the user satisfies design requirements such as a filtering or amplification, and at the same time modulates data. That is, the term "modulation" represents that a signal having data is modulated into a waveform suitable for a transmission channel.

A phase shift keying (PSK) modulation represents a modulation scheme in which a carrier phase is changed to another according to information of a digital signal. The PSK waveform has a certain amplitude or envelope, such that it is less affected by a variation of a level and has a high immunity from a symbol error. A modulated wave is a double sideband signal, such that it has both timing information and frequency information. Therefore, a modulation/demodulation circuit can be configured in the form of a relatively-simplified structure.

A binary PSK (BPSK) modulation matches transmission signals of two values (e.g., 0 or 1) to be transferred with an in-phase and an out-of-phase, respectively, such that it transmits the matched resultant signals. A quadrature phase shift keying (QPSK) modulation collects two bits of '0' and '1' corresponding to digital signals of the two values, matches the collected bits with 4 phases of a carrier, and transmits the matched result.

DISCLOSURE OF INVENTION

Technical Problem

In case of using a coding and modulation scheme in a general data communication, there arise some problems. For example, a demodulator of a receiver unavoidably decodes data using any erroneous packet, or the demodulator mistakes a normal symbol for an erroneous symbol due to a low quality of signal (QoS) even though it can correctly make a decision about the symbol. For another example, a decoder of the receiver is unable to recognize which one of bits in a code block needed for the decoding has generated an error. Accordingly, the receiver needs to perform an error recovery process of all received packets.

The present invention has been devised to solve the above-mentioned problems. An object of the present invention is to provide a communication method for controlling the demodulator and decoder of the receiver to be organically interoperable with a random linear coding block (encoder), such that it can reduce an amount of communication overhead and can effectively overcome an error.

Technical Solution

In order to solve the above-mentioned technical problems, the present invention provides a method for performing a reliable communication using soft decision information and a random linear coding in the wireless access system.

To achieve these objects and other advantages and in accordance with the purpose of the invention, as embodied and broadly described herein, a communication method using soft decision in a wireless access system includes: arranging received random-linear-coded first code blocks in descending order of their soft decision levels; and performing a random linear decoding on a first code block set, wherein the first code block set is constructed of the first code blocks arranged in the descending order of their soft decision levels.

The communication method may further includes, if any error occurs in the random linear decoding step of the first code block set, performing a random linear decoding on a second code block set, wherein the second code block set is constructed when a code block having the lowest soft decision level among code blocks contained in the first code block set is replaced with another first code block.

Each of the random-linear-coded first code blocks may include information of original data, and the first code blocks are independent of each other.

In another aspect of the present invention, there is provided a communication method using soft decision in a wireless access system including: arranging received random-linear-coded first code blocks in descending order of their soft decision levels; requesting retransmission of some first code blocks having soft decision level lower than predetermined soft decision level; rearranging the first code blocks and retransmitted second code blocks in descending order of their soft decision levels; and performing a random linear decoding on a first code block set, wherein the first code block set is constructed of the rearranged first code blocks and the rearranged second code blocks arranged in descending order of their soft decision levels.

The communication method may further include: if any error occurs in the random linear decoding step, performing a random linear decoding on a second code block set, wherein the second code block set is constructed when at least one of code blocks each having a low soft decision level in the first code block set is replaced with at least one code block having the highest soft decision level in the first and second code blocks not contained in the first code block set.

The soft decision level and the predetermined soft decision level may be decided by a receiver according to a communication channel environment.

Each first code block and each second code block may be random-linear-encoded using random coefficients independent of each other.

In another aspect of the present invention, there is provided a communication method using soft decision in a wireless access system, including: transmitting first code blocks to a receiver, wherein the first code blocks are generated by a random-linear-coding of input data; requesting retransmission of some first code blocks having soft decision level lower than predetermined soft decision level; and transmitting the second code blocks to the receiver.

In another aspect of the present invention, there is provided a receiver using soft decision in a wireless access system including: a demodulator which converts received symbols into code blocks by demodulating the received symbols, and transfers the code blocks and their soft decision level information; and a decoder which arranges the code blocks in descending order of their soft decision levels on the basis of the soft decision level information, constructs a code block set in descending order of soft decision levels of the code blocks, and performs a random linear decoding on the constructed code block set.

The decoder may ask a transmitter to retransmit some code blocks among the code blocks, wherein each of the some code blocks to be retransmitted has a soft decision level lower than a predetermined soft decision level.

In another aspect of the present invention, there is provided a transmitter using soft decision in a wireless access system, the receiver including an encoder which generates first code blocks by a random-linear-encoding of input data; and a demodulator which modulates the first code blocks in consideration of a channel environment of a communication channel.

Upon receiving a retransmission request message from a receiver, the encoder may random-linear-code the input data using a random coefficient independent of a random coefficient used for generating the first code blocks, thereby generating second code blocks.

Advantageous Effects

The present invention has the following effects.

Firstly, the present invention can effectively correct an error generated from a communication channel when a transmitter communicates with a receiver using a random linear coding and decoding.

Secondly, when the receiver corrects the error generated from the communication channel, it can effectively use a random linear decoding method using a soft decision level measured by a modulator and a demodulator. Accordingly, the present invention can reduce an amount of overhead generated from the communication channel by more effectively overcoming the error, resulting in the increase of a reliability of data transmission.

BRIEF DESCRIPTION OF DRAWINGS

The accompanying drawings, which are included to provide a further understanding of the invention, illustrate embodiments of the invention and together with the description serve to explain the principle of the invention.

In the drawings:

FIG. 8 is a conceptual diagram illustrating a method for performing a random linear decoding using soft decision information according to another embodiment of the present invention.

MODE FOR THE INVENTION

Figure 1:
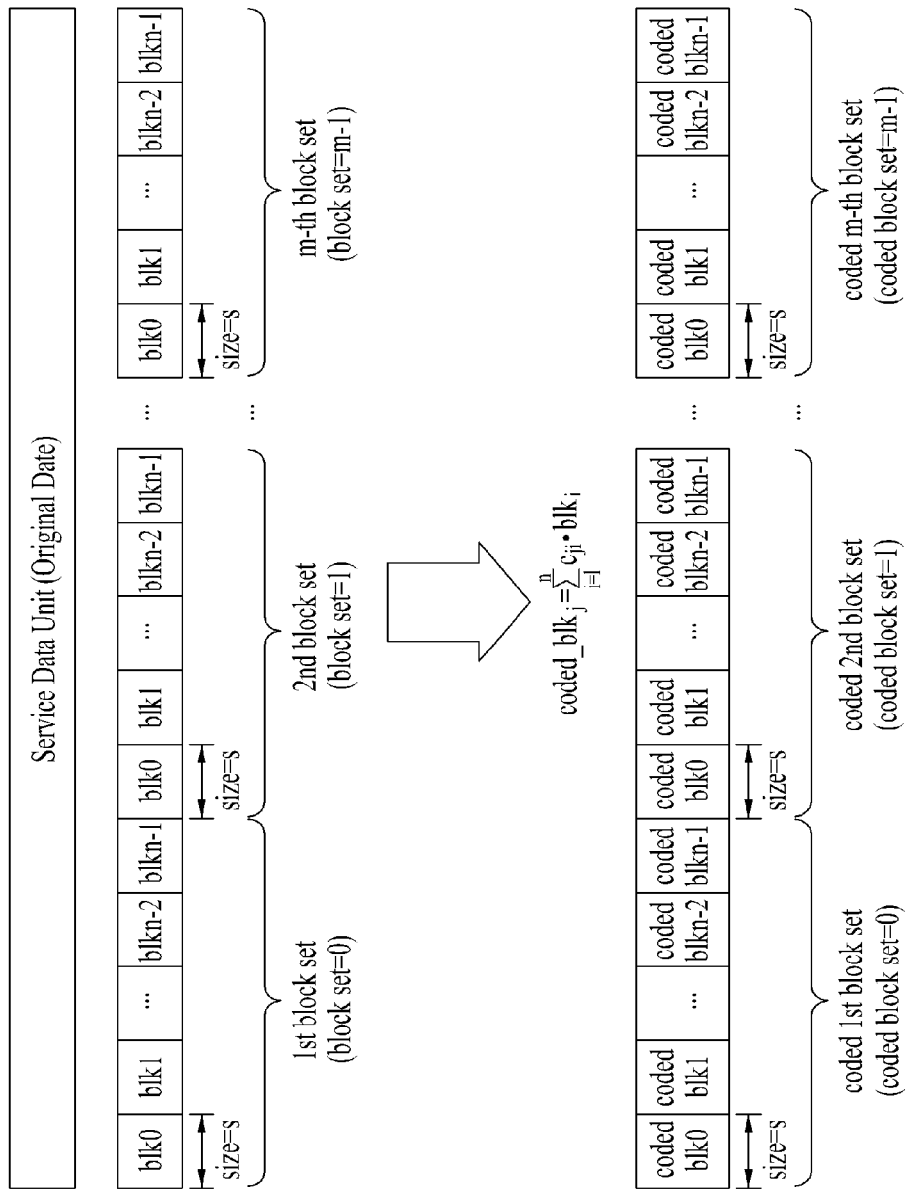
FIG. 1 is a conceptual diagram illustrating a method for coding data block sets using a random linear coding applicable to an embodiment of the present invention.

Reference will now be made in detail to the preferred embodiments of the present invention, examples of which are illustrated in the accompanying drawings. In order to solve the above-mentioned technical problems, the present invention provides a method for performing a reliable communication using soft decision information and a random linear coding in the wireless access system.

The following embodiments are proposed by combining constituent components and characteristics of the present invention according to a predetermined format. The individual constituent components or characteristics should be considered to be optional factors on the condition that there is no additional remark. If required, the individual constituent components or characteristics may not be combined with other components or characteristics. Also, some constituent components and/or characteristics may be combined to implement the embodiments of the present invention. The order of operations to be disclosed in the embodiments of the present invention may be changed to another. Some components or characteristics of any embodiment may also be included in other embodiments, or may be replaced with those of the other embodiments as necessary.

The above-mentioned embodiments of the present invention are disclosed on the basis of a data communication relationship between a base station and a mobile station. In this case, the base station is used as a terminal node of a network via which the base station can directly communicate with the mobile station. Specific operations to be conducted by the base station in the present invention may also be conducted by an upper node of the base station as necessary.

In other words, it will be obvious to those skilled in the art that various operations for enabling the base station to communicate with a terminal in a network composed of several network nodes including the base station will be conducted by the base station or other network nodes other than the base station. The term "Base Station" may be replaced with a fixed station, Node-B, eNode-B (eNB), or an access point as necessary. The term "terminal" may also be replaced with a user equipment (UE), a mobile station (MS), mobile terminal or a mobile subscriber station (MSS) as necessary.

The following embodiments of the present invention can be implemented by a variety of means, for example, hardware, firmware, software, or a combination of them.

In the case of implementing the present invention by hardware, the present invention can be implemented with application specific integrated circuits (ASICs), Digital signal processors (DSPs), digital signal processing devices (DSPDs), programmable logic devices (PLDs), field programmable gate arrays (FPGAs), a processor, a controller, a microcontroller, a microprocessor, etc.

If operations or functions of the present invention are implemented by firmware or software, the present invention can be implemented in the form of a variety of formats, for example, modules, procedures, functions, etc. The software codes may be stored in a memory unit so that it can be driven by a processor. The memory unit is located inside or outside of the processor, so that it can communicate with the aforementioned processor via a variety of well-known parts.

The following embodiments of the present invention may be supported by standard documents disclosed in at least one of various wireless access systems, for example, the IEEE 802 system, the 3GPP system, the 3GPP LTE system, and the 3GPP2 system. In other words, unexplained steps or parts for definitely disclosing the technical idea of the present invention may be supported by the above-mentioned documents. Also, all the terms or terminologies disclosed in the present invention may be explained by the above-mentioned standard documents. Specifically, the embodiments of the present invention may be supported by at least one of standard documents (i.e., P802.16-2004, P802.16e-2005, and P802.16Rev2) of the IEEE 802.16 system.

Prior to describing the present invention, it should be noted that specific terms disclosed in the present invention are proposed for the convenience of description and better understanding of the present invention, and the use of these specific terms may be changed to another format within the technical scope or spirit of the present invention.

The following embodiments of the present invention can encode or code data using a random linear coding (RLC) method. This random linear coding (RLC) method may be used as one of block-coding methods.

The random linear coding (RLC) method represents that each coded block includes information of all blocks contained in an original block set. Accordingly, although some coded blocks are lost during their transmission/reception (Tx/Rx) time, the random linear coding (RLC) method receives another coded block without re-receiving the lost coded blocks, such that it can quickly perform a data recovery. The random linear coding (RLC) method (hereinafter referred to as an RLC coding method) is only a term for defining a data processing method of the present invention, and this term may also be replaced with other equivalents as necessary.

FIG. 1 is a conceptual diagram illustrating a method for coding data block sets using a random linear coding applicable to an embodiment of the present invention.

Referring to FIG. 1, original data represents a service data unit (SDU) transferred from an upper layer of a transmitter. The transmitter can divide the original data into small-sized blocks (or packets). The transmitter collects a predetermined number (n) of divided blocks among all the divided blocks into one group, such that a block set (or segment) can be composed of the n divided blocks of this group.

In this case, the number (n) of data blocks contained in each block set can be decided by a channel environment of a communication network, performance information of the transmitter and receiver, and requirements of an application program. Also, the transmitter can construct a total of M original block sets.

The transmitter generates a random coefficient or random coefficient matrix ($c_{ji}$) for RLC-coding the divided data blocks. The transmitter can code the divided data blocks using the random coefficient matrix ($c_{ji}$) generated by a predetermined rule.

The transmitter is able to perform the coding using the RLC coding method in units of each block set (e.g., in units of n selected blocks). In this case, a set of the n coded blocks may be called a coded block set. Upon receiving the n coded blocks, the receiver is able to perform the RLC decoding method. Hereinafter, the set of coded blocks will be referred to as a coded block set or a code block set, and each coded block will be referred to as a code block.

Each code block generated by the RLC coding method may include information of all blocks contained in an original block set. Therefore, in order to recover a series of information blocks from the received code blocks, the receiver requires random coefficients having been used to code n code blocks and each block of data.

The transmitter generates new random coefficients until the receiver completely decodes data, and makes code blocks, such that it may transmit the code blocks to the receiver. In this case, the transmitter need not transmit the n code blocks in their coding order, and the individual code blocks are independent of each other.

The following equation 1 exemplarily illustrates a method for generating a code block set ($\overline{E}$) generated by coding an original block set ($\overline{S}$).

$$\overline{E} = \overline{H} \times \overline{S} \quad \text{[Equation 1]}$$

In Equation 1, $\overline{H}$ is a coefficient matrix, and represents a method for combining the original block set $\overline{H}$. A method for generating the coefficient matrix $\overline{S}$ is as follows.

The coefficient matrix $\overline{H}$ for use in the RLC coding method can be generated by a random number which has been decided by only the transmitter or both the transmitter and the receiver within a predetermined range. The random number is a specific number extracted from numbers (e.g., 0~255) of the predetermined range at random, wherein the numbers have been decided by an agreement between the transmitter and the receiver.

In addition, the transmitter and the receiver share a seed value needed for generating the random coefficient, such that they may generate the coefficient matrix $\overline{H}$. In this case, the size of the coefficient matrix $\overline{H}$ may be defined as (n × n).

The following equation 2 may be another expression of Equation 1.

$$\text{coded\_blk}_j = \sum_{i=1}^{n} c_{ji} \cdot blk_i \quad \text{[Equation 2]}$$

In Equation 2, the code block may be represented by coded_blk$_j$, and the coefficient matrix may be represented by c$_{ji}$. In addition, the original block may be represented by blk$_i$.

If the transmitter transmits all of n code blocks of a first code block set and then the receiver receives all the n code blocks, the original block set can be recovered by the RLC coding method. Thereafter, the transmitter transmits code blocks contained in the next block set (i.e., a second block set). In this way, data communication between the transmitter and the receiver can be carried out.

A method for controlling an error using the RLC coding method according to the embodiments of the present invention will hereinafter be described in detail.

In order to control the error using the RLC coding method, the size of a data block set, the size of a coded block (i.e., a code block), and a Galois Field (GF) of a random coefficient are first determined. This Galois Field (GF) can be defined as follows. If the GF is denoted by GF($2^2$), a series of data is calculated using symbols each having 2 bits, such that the calculated data can be configured in the form of symbols each having 2 bits. If the GF is denoted by GF($2^8$), a series of data is calculated using symbols each having 8 bits, such that the calculated data can be configured in the form of symbols each having 8 bits.

If the size of the data block set and the size of the coded block are decided, the number (n) of code blocks needed for the random linear decoding may be decided. Also, random coefficients needed for the RLC coding are generated according to the decided Galois Field (GF), and the coding of data can be carried out using the random coefficients. The transmitter is able to transmit the above random coefficients simultaneously while transmitting the code blocks. In addition, the transmitter and the receiver may pre-share the random coefficients. In this case, the transmitter may transmit only index information of the random coefficient, which has been used to decode each code block, to the receiver. In case of a sequential data transmission in which a Tx signal does not disappear during a communication mode, the transmitter and the receiver can respectively perform the coding and the decoding by sequentially employing predetermined random coefficients.

Figure 2:
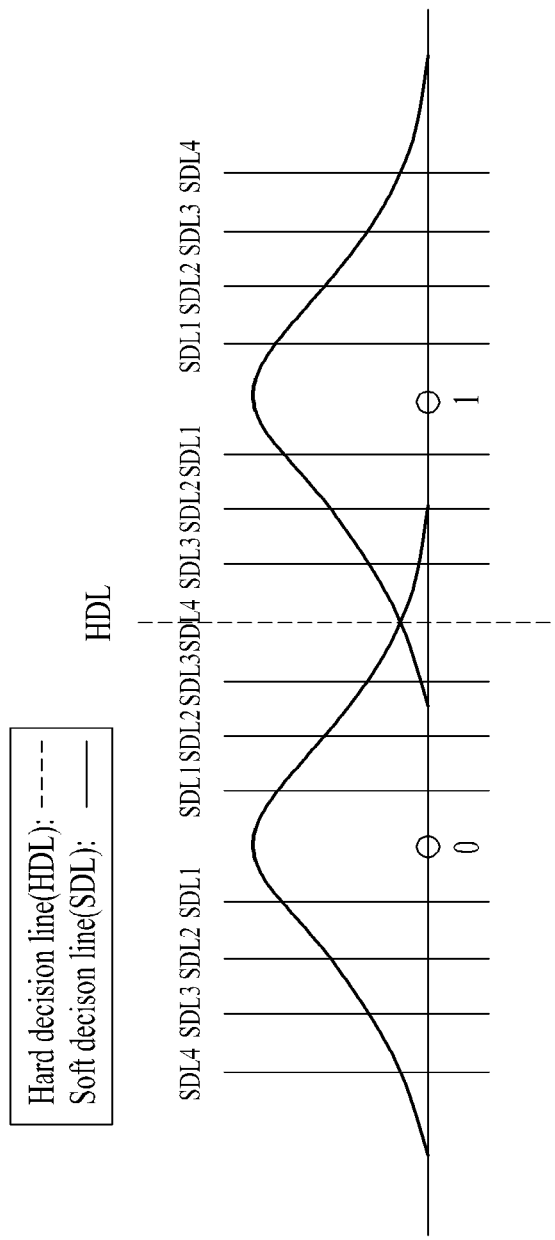
FIG. 2 illustrates a hard decision method and a soft decision method using a binary phase shift keying (BPSK) as an example.

FIG. 2 illustrates a hard decision method and a soft decision method using a binary phase shift keying (BPSK) as an example.

The hard decision represents that output data of a demodulator for use in digital communication is represented by a binary number of 0 or 1. In more detail, the hard decision is used to make a definite decision to represent a symbol received in the demodulator by bits used as a corresponding binary signal. The soft decision represents that a quantization level of the output data of the demodulator is equal to or higher than '2'. In more detail, the soft decision is used as an index of indicating how long the symbol received in the demodulator is distant from a correct position.

In FIG. 2, a dotted line indicates a hard decision line (HDL) and a solid line indicates a soft decision line (SDL). In FIG. 2, '0' and '1' are values which are distinguished from each other by the hard decision line (HDL). In case of the soft decision line (SDL), SDL1 close to 0 or 1 indicating a correct position of the symbol has the highest soft decision level, and SDL4 has the lowest soft decision level. The higher the soft decision level, the lower the error ratio. In contrast, the higher the soft decision level, the lower an amount of processed data. The lower the soft decision level, the higher the error ratio. In contrast, the lower the soft decision level, the higher the amount of processed data.

Figure 3:
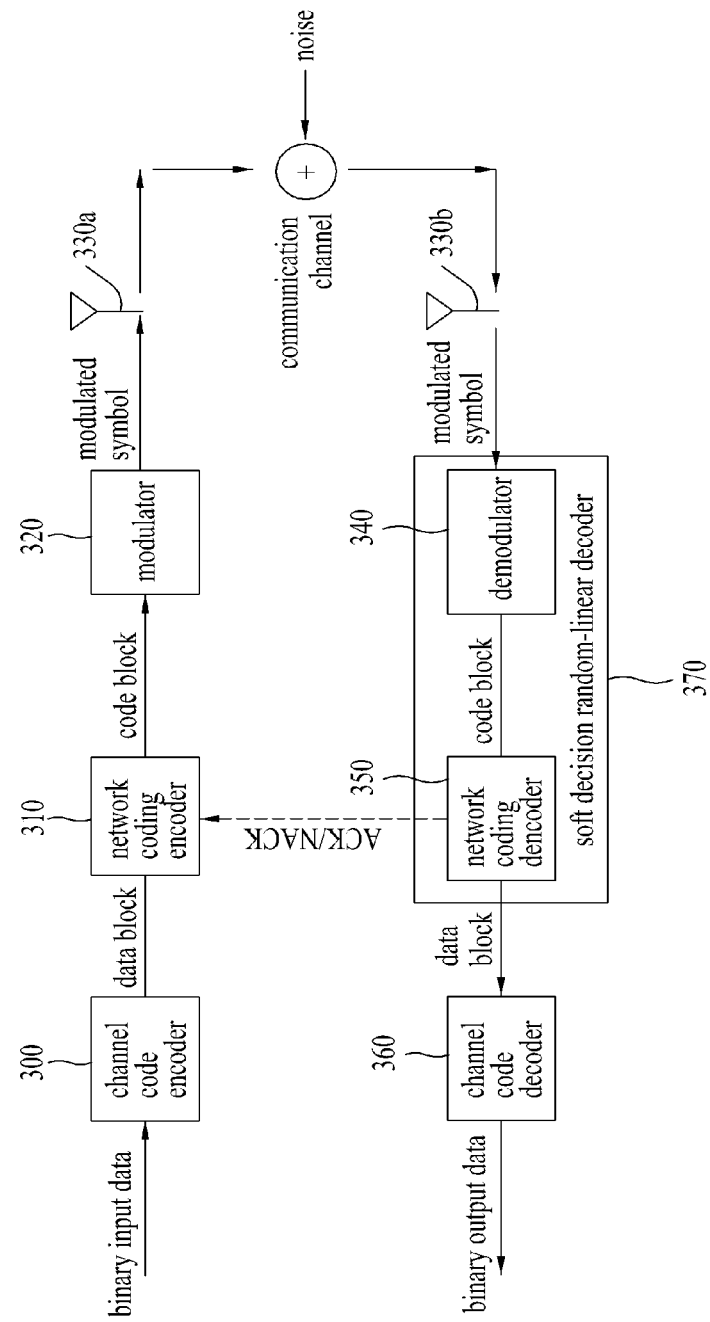
FIG. 3 is a block diagram illustrating a transmitter and a receiver having a soft decision random-linear decoder according to an embodiment of the present invention.

FIG. 3 is a block diagram illustrating a transmitter and a receiver having a soft decision random linear decoder according to an embodiment of the present invention.

Referring to FIG. 3, the transmitter may include a channel code encoder 300, a network coding encoder 310, a modulator 320, and an antenna 330a. The receiver may include an antenna 330b, a demodulator 340, a network coding decoder 350, and a channel code decoder 360. In this case, the embodiment of the present invention combines the demodulator 340 and the network coding decoder 350, such that the combination of them may be used as a soft decision random linear decoder 370.

Referring to FIG. 3, binary input data is applied to the channel code encoder 300. The binary input data may be modified into data blocks of an appropriate format, such that the channel code encoder 300 can apply the RLC method to the modified data blocks. The data blocks are applied to the network code encoder 310. The network coding encoder 310 codes the data blocks into code blocks using the RLC coding method. In this case, the RLC coding method may be equal to that of FIG. 1.

The network coding encoder transmits the random-linear-coded code blocks to the modulator 320. The demodulator may modulate the code blocks into symbols using a variety of modulation methods. The transmitter transmits the modulated symbols to the receiver via a communication channel formed between the transmitter and the receiver. The symbols propagated via the antenna 330a of the transmitter are applied to the antenna 330b of the receiver. In this case, unexpected noise may occur in the communication channel.

The modulated symbols received via the antenna 330b of the receiver are applied to the demodulator 340 contained in the soft decision random linear decoder 370. The demodulator may demodulate the received symbols according to a demodulation method decided by a channel environment. The code blocks demodulated by the demodulator 340 are applied to the network coding decoder 350. The demodulator 340 can transmit the soft decision level to the network coding decoder 350.

The network coding decoder 350 may decode the code blocks into data blocks using the random linear decoding method. However, the signal received in the network coding decoder 350 may have unexpected errors although the demodulator 340 uses a strict signal detection rule. In order to correct such errors, the network coding decoder 350 may ask the transmitter to retransmit as many symbols as the number of errors using ACK/NACK signals.

The channel code decoder 360 having received the data blocks from the network coding decoder 350 combines the received data blocks with each other, and converts the combined result into binary data. However, the channel code encoder 300 and the channel encode decoder 360 may be optionally used according to user requirements, and they are complementary to each other.

Figure 4:
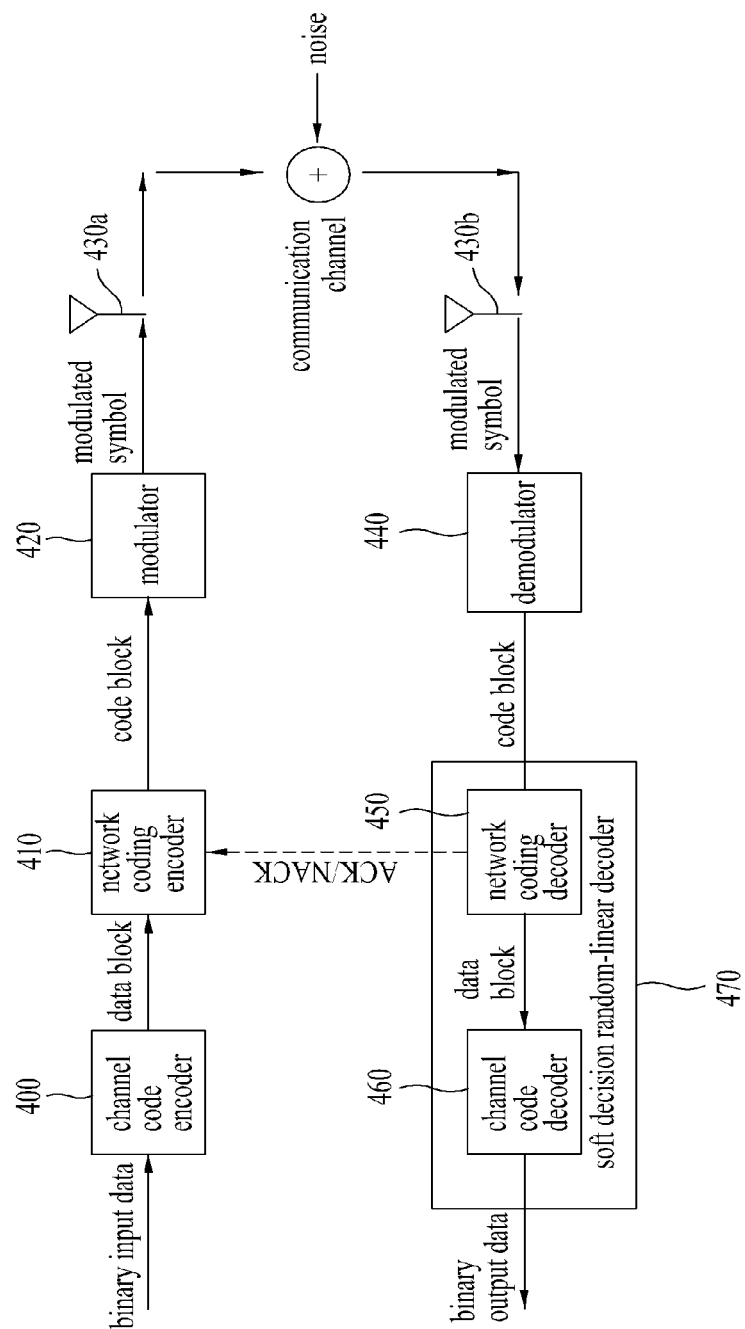
FIG. 4 is a block diagram illustrating a transmitter and a receiver having a hybrid decoder according to another embodiment of the present invention.

FIG. 4 is a block diagram illustrating a transmitter and a receiver having a hybrid decoder according to another embodiment of the present invention.

Referring to FIG. 4, the transmitter includes a channel code encoder 400, a network coding encoder 410, a modulator 420, and an antenna 430a. The receiver includes an antenna 430b, a demodulator 440, a network coding decoder 450, and a channel code decoder 460. In this case, the network coding decoder 450 and the channel code decoder 460 may construct one hybrid decoder 470.

Basic operations of FIG. 4 are similar to those of FIG. 3. However, the network coding decoder 450 and the channel code decoder 460 are combined with each other in FIG. 4, whereas the network coding decoder 350 and the decoder 340 are combined with each other in FIG. 3.

The hybrid decoder 470 of FIG. 4 may include the network coding decoder 450 and the channel code decoder 460. If an error still exists although the network coding decoder 450 contained in the hybrid decoder 470 corrects the error. The erroneous code block set (or segment) is transferred to the channel code decoder 460. The channel code decoder 460 performs an error correction procedure, and then reports the error correction result to the network coding decoder 450. In order to obviate the error, the network coding decoder 450 may ask the network coding encoder 420 of the transmitter to transmit any additional code block needed for the error correction.

In more detail, if an error still exists although the network coding encoder 450 of the receiver performs the random linear decoding and then the channel code decoder 460 performs error correction, the network coding decoder 450 may transmit ACK/NACK signals to the network coding encoder 410. There are a variety of RLC-based error correction methods, for example, a method for enabling the receiver to select a predetermined number of code blocks and decode the selected code blocks during the decoding process of the receiver, and a method for enabling the transmitter to retransmit another code block when there is any error in a previous code block.

Therefore, if at least one of the transmitter and the receiver uses both the RLC method and the channel coding method, the error can be more effectively corrected under a certain situation. In this case, a variety of channel coding methods can be used, for example, a convolution code, a turbo-code, and an LDPC code.

Figure 5:
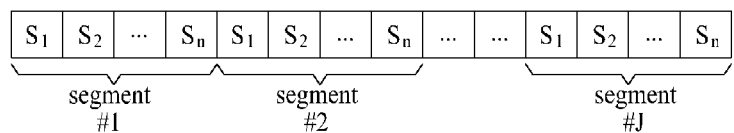
FIG. 5 is a conceptual diagram illustrating a method for constructing a segment (or a block set) for use in embodiments of the present invention.
Figure 5:
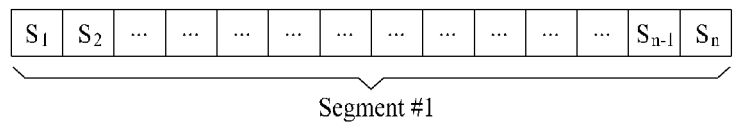

FIG. 5 is a conceptual diagram illustrating a method for constructing a segment (or a block set) for use in embodiments of the present invention.

Referring to FIG. 5, the transmitter may construct data blocks for use in the channel coding as a segment acting as a unit of the RLC coding or random-linear-decoding. Each segment may include a predetermined number (n) of data blocks needed for the RLC coding and random-linear-decoding.

In FIG. 5(a), all data blocks may be composed of T number of segments (i.e., J segments). It is assumed that each segment includes 'n' number of data blocks (i.e., n data blocks). Here, T or 'n' represents an arbitrary number, and may be changeable according to a user requirement or a channel environment. In FIG. 5(b), all data blocks construct one segment.

It is preferable that a coding rate for use in the channel coding of FIG. 5(a) or 5(b) may be set to a specific coding rate at which any error generated in bits corresponding to at least one segment can be corrected.

For example, as can be seen from FIG. 5(a), it is assumed that the size of total data is 1000 bits and one segment is divided into 10 segments, each of which has 100 bits. It is assumed that total data is used to encode information bits at a specific coding rate, and the size of data blocks contained in each segment is 10 bits. At this time, if the receiver does not obviate the error generated from one segment, this condition may be considered to be the occurrence of an error of 100 bits. In this case, an error of at least 100 bits should be corrected to increase the channel coding effect, such that it is preferable that a coding rate having an error correction capability of at least 100 bits may be selected and encoded.

If the size of total data is equal to one RLC segment as shown in FIG. 5(b) and any error occurs in a corresponding segment, retransmission of the total data is needed. Accordingly, an upper layer such as a medium access control (MAC) layer may use a method for correcting the error of the data block, for example, an ARQ method.

Figure 6:
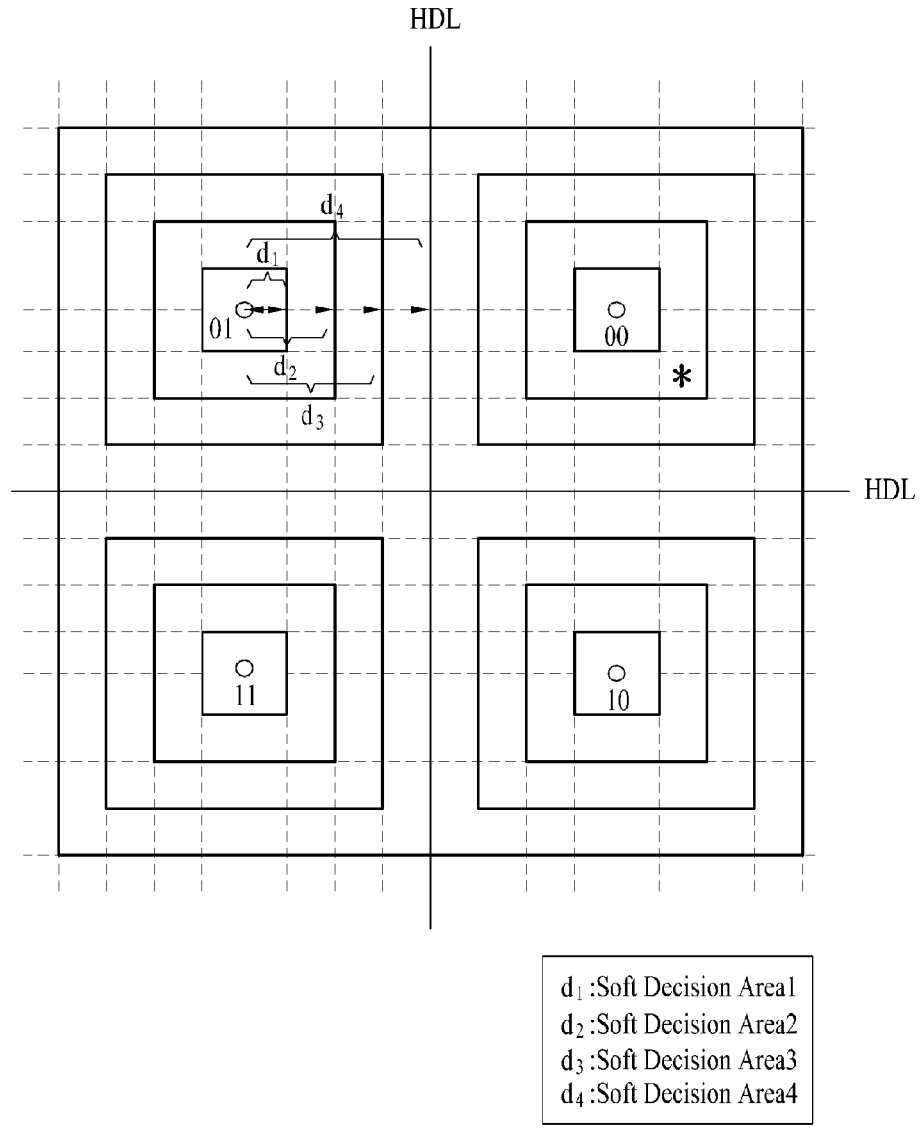
FIG. 6 illustrates soft decision level areas of a demodulator so as to use a soft decision random linear decoding method according to one embodiment of the present invention.

FIG. 6 illustrates soft decision level areas of a demodulator so as to use a soft decision random linear decoding method according to one embodiment of the present invention.

FIG. 6 illustrates a soft decision method for use in a demodulator using a QPSK symbol as an example. The method of FIG. 6 may also be applied to other modulation methods other than a QPSK method. Referring to FIG. 6, a hard decision line (HDL) is a boundary at which a distance between points representable by each symbol is equally divided. A soft decision area divides correct positions of the hard decision line (HDL) and the symbol by an integer. For the convenience of description and better understanding of the present invention, the embodiment of the present invention assumes that the number of soft decision areas is 4, i.e., a first soft decision area $d_1$, a second soft decision area $d_2$, a third soft decision area $d_3$, and a fourth soft decision area $d_4$. The higher the integer (n) deciding the soft decision areas, the higher the error correction accuracy of the receiver.

In FIG. 6, an area having a signal (*) received in the receiver is the soft decision area $d_2$ of a second level (i.e., the second soft decision area $d_2$). Accordingly, the demodulator of the receiver may transfer hard decision information (e.g., '00' bits) and soft decision information (e.g., $d_2$) related to the soft decision area. Therefore, the network coding decoder may decode data using the hard and soft decision information received from the demodulator.

Figure 7:
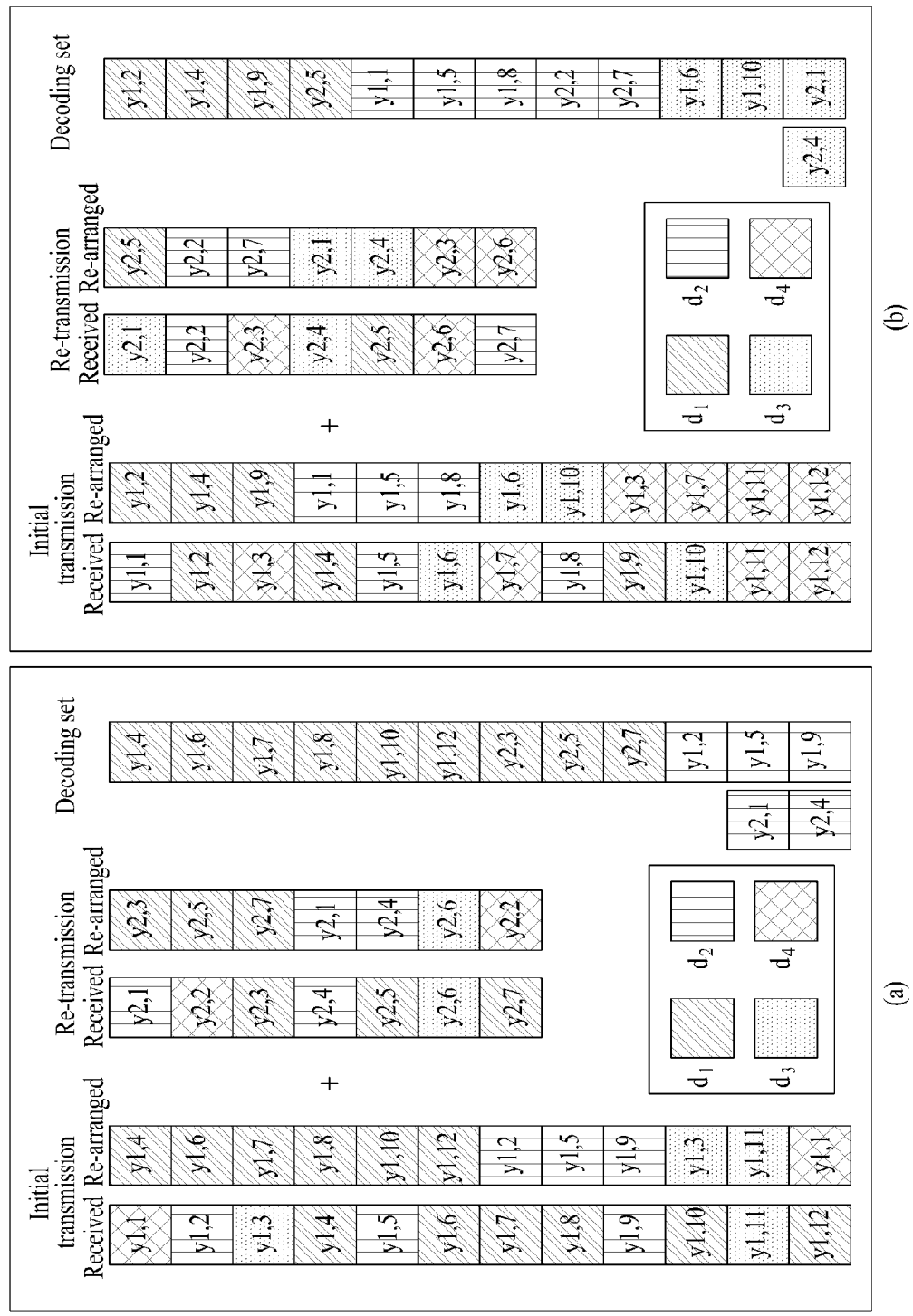
FIG. 7 is a conceptual diagram illustrating a method for performing a random linear decoding using soft decision information according to one embodiment of the present invention.

FIG. 7 is a conceptual diagram illustrating a method for performing a random linear decoding using soft decision information according to one embodiment of the present invention.

In FIG. 7, it is assumed that the number (n) of code blocks needed for the RLC coding and random-linear-decoding is 12. At this time, 12 code blocks may construct one segment (or a code block set). In this embodiment, each code block is modulated such that a symbol is formed. However, the size of the code block may be equal to that of the symbol because one code block is divided on the basis of a symbol unit.

In case of a code block $y_{a,b}$ of FIG. 7, 'a' is the number of transmission times, and 'b' is an index of a code block. If 'a' is set to 1, this value indicates an initial transmission code block. If 'a' is set to 2, this value indicates a retransmission code block. 'b' is a code block devised for only the convenience of description, any number corresponding to this 'b' value does not greatly affect the encoding and decoding.

In FIG. 7, it is assumed that $d_1$ is a first soft decision area, $d_2$ is a second soft decision area, $d_3$ is a third soft decision area, and $d_4$ is a fourth soft decision area. As can be seen from FIG. 7, the demodulator converts symbols into code blocks by demodulating the symbols, and transmits both the code blocks and the soft decision information to the network coding decoder.

FIG. 7(a) shows a good channel environment, in which a soft decision level of each code block received in the receiver is relatively high. In FIG. 7(a), the network coding decoder of the receiver receives 12 code blocks during the initial transmission. The receiver arranges the 12 code blocks using soft decision information. As a result, it can be recognized that the receiver has received six code blocks contained in the first soft decision area $d_1$, three code blocks contained in the second soft decision area $d_2$, two code blocks contained in the third soft decision area $d_3$, and only one code block contained in the fourth soft decision area $d_4$. However, the rearrangement in this embodiment can be carried out in the demodulator or the network coding decoder.

After the initial transmission has been completed, the network coding decoder may perform the decoding using the received code blocks. In an embodiment of the present invention, it is assumed that there is any additional code block for detecting any error and the receiver is able to recognize only the presence or absence of the error after performing the decoding. In other words, each segment may include an error detection code such as a cyclic redundancy code, such that the receiver is able to recognize the presence or absence of the error after performing the random linear decoding.

If the receiver recognizes the presence of the error in a predetermined code block after performing the decoding, it may request retransmission of the code block from the transmitter. In this case, the number of code blocks to be retransmitted may be determined by the network coding decoder of the receiver. In this embodiment of the present invention, the number of code blocks to be retransmitted may be equal to the number of the remaining code blocks other than the code blocks contained in $d_1$, or may also be equal to the number of the remaining code blocks other than code blocks contained in $d_1$ or $d_2$. That is, a soft decision area (level) to be retransmitted may be determined by the network coding decoder in consideration of a communication channel environment.

In FIG. 7(a), the receiver may ask the transmitter to retransmit at least the remaining code blocks (e.g., 7 code blocks) other than the code blocks contained in $d_1$. The transmitter generates the random-linear-coded 7 code blocks upon receiving a request from the receiver. In this case, the random coefficient used for encoding the 7 code blocks should be another random coefficient independent of a first random coefficient used for the initial transmission. The demodulator of the transmitter modulates the 7 code blocks into 7 symbols, and transmits the 7 symbols to the receiver.

If the receiver receives 7 symbols, then the demodulator of the receiver demodulates the 7 symbols into 7 code blocks. The demodulator may transfer the code blocks and soft decision information detected during the demodulation to the network coding decoder. The network coding decoder rearranges the retransmitted code blocks on the basis of the soft decision information.

It is assumed that the number of code blocks contained in d1 among the retransmitted code blocks is 3, the number of code blocks contained in $d_2$ is 2, and the number of code blocks contained in $d_3$ or $d_4$ is 1. In this case, not only the retransmitted code blocks but also the initially-transmitted code blocks can be rearranged on the basis of their soft decision levels.

The network coding decoder of the receiver may construct a decoding set (or a code block set) using the initially-received code blocks and the retransmitted code blocks. In this case, the network coding decoder may select code blocks in the order of descending soft decision levels (e.g., in the order of $d_1 \rightarrow d_2 \rightarrow d_3 \rightarrow d_4$), such that it may construct a decoding set. That is, the network coding decoder may construct the decoding set using code blocks each having a high soft decision level.

If any error occurs in the decoding result, the network coding decoder may construct another decoding set. In this case, the network coding decoder selects a specific code block having the highest soft decision level among code blocks unused for constructing the decoding set, replaces the selected specific code block with any code block, having the same soft decision level as that of the specific code block, among code blocks of the pre-decoded decoding set, and then performs the decoding.

For example, the receiver may detect an error when performing the decoding using the decoding set of FIG. 7(a). In this case, the receiver sequentially replaces $y_{2,1}$ contained in $d_2$ with $y_{1,2}$, $y_{1,5}$ or $y_{1,9}$, and at the same time performs the decoding. If the receiver succeeds in decoding, it stops the decoding. If the error continuously occurs, the receiver selects two elements among $y_{1,2}$, $y_{1,5}$ and $y_{1,9}$, and respectively replaces $y_{2,1}$ and $y_{2,4}$ with the two elements, such that the decoding can be carried out.

In more detail, the probability of generating an error in the code block having the highest soft decision level d1 is the lowest value, and the probability of generating an error in the code block having a relatively low soft decision level $d_2$ is high, such that code blocks each having the low soft decision level may be replaced with others, resulting in the implementation of error correction.

FIG. 7(b) illustrates a method for performing the decoding in the same manner as in FIG. 7(a) although a channel environment is worse than that of FIG. 7(a). In FIG. 7(b), the receiver may receive 12 code blocks during first transmission (i.e., initial transmission). The receiver may arrange the code blocks in the order of soft decision levels. According to the arrangement result, it can be recognized that the number of code blocks contained in $d_1$ is 3, the number of code blocks contained in $d_2$ is 3, the number of code blocks contained in $d_3$ is 2, and the number of code blocks contained in $d_4$ is 4.

In order to perform the decoding, the receiver may ask the transmitter to retransmit the remaining code blocks other than code blocks contained in $d_1$ and $d_2$. In this case, the receiver may ask the transmitter to retransmit code blocks (e.g., 7 code blocks) more than the code blocks contained in $d_3$ and $d_4$. Therefore, the transmitter generates as many code blocks as the number of requested code blocks, and transmits them to the receiver. In FIG. 7(b), the receiver may rearrange the retransmitted blocks in the order of soft decision levels. The receiver may construct a decoding set in the order of descending soft decision levels among the initial transmission code blocks and the retransmission code blocks. The decoding set of FIG. 7(b) includes 4 code blocks contained in $d_1$, 5 code blocks contained in $d_2$, and 3 code blocks contained in $d_3$.

The receiver performs the random linear decoding using the decoding set. If any error occurs in this decoding, one ($y_{1,6}$, $y_{1,10}$ or $y_{2,1}$) of code blocks contained in $d_3$ is sequentially replaced with another code block ($y_{2,4}$) contained in $d_3$, and at the same time the decoding can be carried out.

In FIGS. 7(a) and 7(b), the receiver arranges the initial transmission code blocks and the retransmission code blocks in descending order of their soft decision levels, such that it can sequentially construct the decoding set. If any error occurs in the decoding, code blocks each having a low soft decision level among the code blocks selected for constructing the decoding set are replaced with others, and the decoding process is then carried out. In this case, a reference soft decision level used as a reference for replacing the low soft decision level-code blocks with others may be determined by the receiver in consideration of a communication channel environment, such that the probability of success of the decoding may increase.

Figure 8:
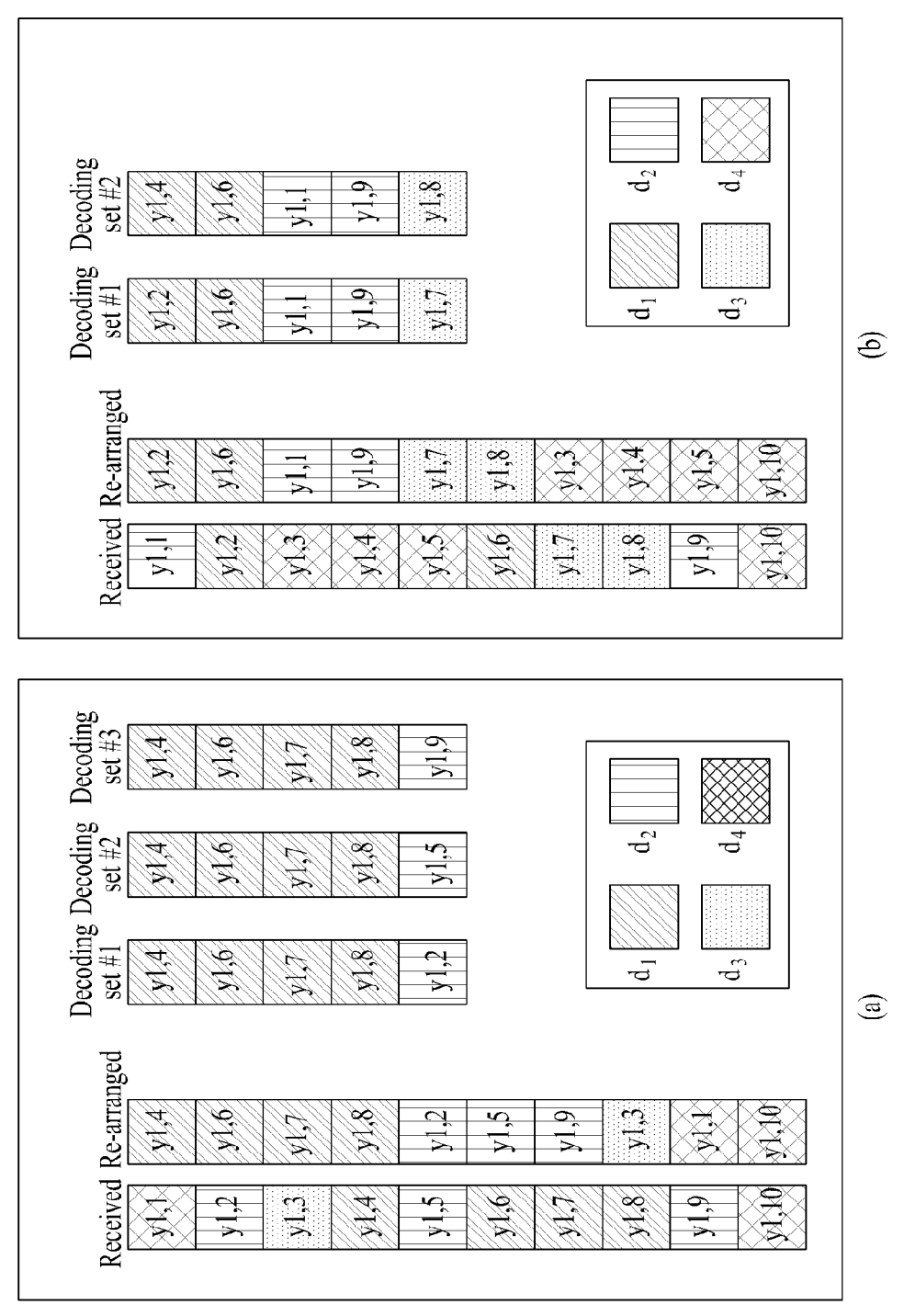

FIG. 8 is a conceptual diagram illustrating a method for performing a random linear decoding using soft decision information according to another embodiment of the present invention.

FIG. 8 shows an exemplary case in which the network coding encoder of the transmitter generates code blocks at a coding rate of at least 1 and transmits the code blocks. That is, for the convenience of description and better understanding of the present invention, FIG. 8 assumes that the number of code blocks transferred from the transmitter is higher than the number (e.g., n) of blocks needed for the decoding, and a detailed description thereof will hereinafter be described.

The receiver arranges one or more received code blocks in the order of soft decision levels, select n code blocks, which are arranged in the order of descending soft decision levels, from among all the arranged code blocks, and may construct a decoding set. In this case, the receiver properly replaces low soft decision level code blocks among all the code blocks contained in the decoding set with others, and at the same time can carry out the decoding. As a result, the receiver is able to successfully increase the decoding probability without asking the transmitter to retransmit other code blocks. In other words, the receiver assigns priorities to the received code blocks in the order of soft decision levels, and may preferentially use code blocks each having a low probability of generating the error in the decoding.

FIG. 8 shows another embodiment of the present invention, wherein it is assumed that the coding rate is 2. That is, in FIG. 8, if the number of code blocks needed for the decoding is 5, the number of code blocks, which must be encoded and transmitted by the transmitter, is 10.

FIG. 8(a) shows a good channel environment, in which a soft decision level of each code block received in the receiver is relatively high. In FIG. 8(a), the receiver is able to receive 10 code blocks. The receiver arranges the received code blocks on the basis of their soft decision levels. The receiver selects code blocks each having a high soft decision level from among the received code blocks, such that it may construct a first decoding set #1 needed for the decoding using the selected code blocks. For example, it is assumed that the receiver selects 5 code blocks needed for the decoding. In this case, the receiver selects four code blocks contained in the highest soft decision level $d_1$, and then selects one ($y_{1,2}$) of code blocks contained in the next soft decision level $d_2$, such that it may construct a first decoding set.

If the decoding of the first decoding set makes a failure, a code block (e.g., $y_{1,5}$) having the lowest soft decision level in the first decoding set is properly replaced with another code block, such that a second decoding set may be constructed. If any error still occurs in decoding the second decoding set, a third decoding set is constructed, such that the decoding process can be carried out on the third decoding set.

In other words, the probability of generating the error in the code block having a high soft decision level is low and the probability of generating the error in another code block having a relatively low soft decision level is high, such that the code blocks having the low soft decision level are replaced with others, resulting in error correction.

FIG. 8(b) illustrates an exemplary case in which soft decision levels of the received code blocks are relatively low due to a channel environment worse than that of FIG. 8(a). The receiver selects 5 code blocks needed for the decoding from among 10 received code blocks, such that it may construct a decoding set using the 5 code blocks. For example, the receiver uses two code blocks contained in the highest soft decision level $d_1$, two code blocks contained in the next soft decision level $d_2$, and one of two code blocks contained in $d_3$, such that it may construct a first decoding set #1 using the five code blocks.

If any error occurs when the receiver decodes the first decoding set #1, the receiver constructs a second decoding set #2 using other code blocks contained in $d_3$, and may perform the decoding of the second decoding set #2.

In case of using the method of FIG. 8, the receiver need not request retransmission from the transmitter in order to perform error correction, the error control can be more effectively carried out.

In addition, the concept of FIG. 8 can also be applied to a combination of the method of FIG. 8 and the retransmission requesting method of FIG. 7. The method of FIG. 8 transmits data at a coding rate of at least 1. That is, the method of FIG. 8 can be applied to the initial transmission, and the method of FIG. 7 can be applied to retransmission code blocks.

It will be apparent to those skilled in the art that various modifications and variations can be made in the present invention without departing from the spirit or scope of the invention. Therefore, the above-mentioned detailed description must be considered for only illustrative purposes instead of restrictive purposes. The scope of the present invention must be decided by a rational analysis of claims, and all modifications within equivalent ranges of the present invention are contained in the scope of the present invention. It is apparent that the present invention may be embodied by a combination of claims which do not have an explicit cited relation in the appended claims or may include new claims by amendment after application.

INDUSTRIAL APPLICABILITY

As apparent from the above description, the embodiments of the present invention can be applied to a variety of wireless access systems, for example, a 3rd Generation Partnership Project (3GPP), a 3GPP2, and/or an IEEE 802.xx (Institute of Electrical and Electronic Engineers 802) system. The embodiments of the present invention can be applied to not only the various wireless access systems but also all the technical fields acquired by the application of these wireless access systems.

The invention claimed is:

1. A communication method using soft decision in a wireless access system, the method comprising:
  receiving, by a receiver, first code blocks from a transmitter;
  arranging the received first code blocks in descending order of their soft decision levels;
  transmitting a retransmission request message requesting a retransmission of at least one of the first code blocks having a soft decision level lower than a predetermined soft decision level;
  receiving at least one of second code blocks retransmitted in response to the retransmission request message;
  rearranging the first code blocks and the retransmitted second code blocks in descending order of their soft decision levels; and
  performing a first random linear decoding on a first code block set, wherein the first code block set is constructed of the rearranged first code blocks and the rearranged second code blocks arranged in descending order of their soft decision levels,
  wherein the first code blocks and the second code blocks are random-linear-coded.

2. The communication method according to claim 1, further comprising:
when any error occurs in the first random linear decoding on the first code block set,
constructing a second code block set by replacing a code block which has the lowest soft decision level in the first code block set with another first code block; and
performing a second random linear decoding on the second code block set.

3. The communication method according to claim 1, wherein the soft decision level and the predetermined soft decision level are decided by the receiver according to a communication channel environment.

4. The communication method according to claim 1, wherein each first code block and each second code block are random-linear-encoded using random coefficients independent of each other.

5. An apparatus for communication using soft decision in a wireless access system, the apparatus comprising:
one or more antennas:
a demodulator; and
a network coding decoder,
wherein the one or more antennas are configured to receive first code blocks from a transmitter,
wherein the demodulator is configured to arrange the received first code blocks in descending order of their soft decision levels,
wherein the apparatus transmits by using the one or more antennas a retransmission request message requesting a retransmission of at least one of the first code blocks having a soft decision level lower than a predetermined soft decision level,
wherein the one or more antennas are configured to receive at least one of second code blocks retransmitted in response to the retransmission request message,
wherein the demodulator is configured to rearrange the first code blocks and the retransmitted second code blocks in descending order of their soft decision levels,
wherein the network coding decoder is configured to perform a first random linear decoding on a first code block set, wherein the first code block set is constructed of the rearranged first code blocks and the rearranged second code blocks arranged in descending order of their soft decision levels, and
wherein the first code blocks and the second code blocks are random-linear-coded.

6. The apparatus according to claim 5, wherein if any error occurs in the first random linear decoding on the first code block set,
the demodulator is further configured to construct a second code block set by replacing a code block which has the lowest soft decision level in the first code block set with another first code block, and
the network coding decoder is further configured to perform a second random linear decoding on the second code block set.

7. The apparatus according to claim 5, wherein the soft decision level and the predetermined soft decision level are decided by a receiver according to a communication channel environment.

8. The apparatus according to claim 5, wherein each first code block and each second code block are random-linear-encoded using random coefficients independent of each other.

* * * * *